United States Patent [19]

Helms et al.

[11] Patent Number: 4,869,801
[45] Date of Patent: Sep. 26, 1989

[54] APPARATUS FOR MOUNTING WORKPIECES

[75] Inventors: Dirk Helms, Ahrensburg; Werner Katzschner, Berlin; Anton Pawlakowitsch, Alzenau; Friedrich Anderle, Hanau, all of Fed. Rep. of Germany

[73] Assignee: Leybold Aktiengesellschaft, Hanau I., Fed. Rep. of Germany

[21] Appl. No.: 170,716

[22] Filed: Mar. 21, 1988

[30] Foreign Application Priority Data

Feb. 5, 1988 [DE] Fed. Rep. of Germany ....... 3803411

[51] Int. Cl.$^4$ ............................................. C23C 14/34
[52] U.S. Cl. .................................... 204/298; 156/345; 204/192.1; 414/222; 414/225
[58] Field of Search ..... 204/298 C, 298 GF, 298 NH, 204/298 SC, 298 SM, 298 MC, 298 E, 298 EG, 298 EM, 192.1; 156/345; 414/217, 222, 225

[56] References Cited

U.S. PATENT DOCUMENTS

| 4,439,261 | 5/1984 | Pavone et al. | 204/298 EM |
| 4,523,985 | 6/1985 | Dimock | 204/298 MC |
| 4,654,106 | 3/1987 | Davis et al. | 204/298 EM |
| 4,701,251 | 10/1987 | Beardow | 204/298 MC |

Primary Examiner—Nam X. Nguyen
Attorney, Agent, or Firm—Felfe & Lynch

[57] ABSTRACT

In an apparatus for mounting discoidal substrates in a vacuum chamber for reactive ionic etching purposes, a substrate holder joined to a hollow shaft and a bottom plate under the substrate holder are disposed, which together with spacers and a clamping ring form a displaceable cage partially surrounding the substrate holder and held coaxial to the latter, while the substrate which can be introduced through a gap in the lateral wall of the cage between two spacers can be laid on the substrate holder and locked in place there by the clamping ring after a relative movement between the substrate holder and the cage.

11 Claims, 3 Drawing Sheets

APPARATUS FOR MOUNTING WORKPIECES

BACKGROUND OF THE INVENTION

The invention relates to an apparatus for mounting workpieces, preferably discoidal substrates, in a vacuum chamber for the purposes of a surface treatment, especially for reactive ionic etching or coating by cathode sputtering.

In a known apparatus of the kind in question the substrate is, in a first phase, deposited on a substrate support in a special loading and unloading station disposed in the vacuum chamber, the substrate support being disposed at the free end of an arm that is mounted so as to pivot about a vertical axis. In a second phase, the arm then advances the substrate together with the substrate support into the range of the ion source or of the cathode. After the surface treatment has been performed, the arm is then swung back, in a third phase, to the loading station where the substrate is lifted from the substrate support by a suction cup and delivered to a conveying device. This known apparatus has the disadvantage that it takes up a comparatively great amount of space in the vacuum chamber, that it is slow and noisy in operation, that it does not allow the substrate to cool sufficiently, and also that it is not capable of rotating the substrate during the surface treatment and varying its position with respect to the ion source or tilting it.

It is the object of the present invention to create an apparatus of the kind described above, which will not have the disadvantages of known apparatus, will operate quickly and handle the substrates gently, will be very reliable in operation, and will be inexpensive to manufacture.

This object is achieved according to the invention by a substrate support joined to a hollow shaft, a base plate disposed underneath the substrate support, which together with spacing means and a clamping ring or fingers extending approximately parallel to the plane of the substrate support, forms a displaceable cage partially surrounding the substrate support and held coaxial with the substrate support, while the substrate which is introducible through a gap in the side wall of the cage between two spacers can be deposited on the substrate support and can be held there by the clamping ring or the fingers after a relative movement between the substrate support and the cage.

Preferably the hollow shaft bearing the substrate support is provided with passages which at one end correspond with infeed and outfeed lines and at the other end correspond with cooling passages in the substrate support or a chamber formed between the substrate support surface and the substrate.

To permit a precise laying of the substrate on the substrate support surface the cage is displaceable with respect to the substrate support by one or more actuators, e.g., a hydraulic or pneumatic cylinder, or by lifting means equipped with spindle-and-nut drives.

Also provided for this purpose is a loading and unloading arm which can be driven transversely of the longitudinal axis of the hollow shaft into an opening or a slot which is formed by two adjacent spacers, the clamping ring and the bottom plate of the cage, and whose end facing the apparatus is provided with a mounting for the substrate, the mounting having openings through which the lifting pins reach which are disposed on the bottom plate of the cage and thus come in contact with the substrate and ca lift it up or lay it down on the mounting.

The hollow shaft can best be driven through a gear or cogbelt drive by a motor, and for this purpose it is held in a bearing in the housing cover, the housing being mounted for pivoting about a shaft on the frame of the apparatus, which is parallel to the plane of the surface of the substrate support.

Advantageously, the bottom plate is supported on at least one lifting rod or plunger, the lifting rods or plungers being driven by a jack or a mechanically operated lifting device driven by a motor through a cogbelt.

The lifting rod in that case is supported on a two-armed differential lever whose ends cooperate with the connecting rods of cylinders which are inserted into the hydraulic circuit.

To provide for a good cooling of the substrate, the hollow shaft has a plurality of axis-parallel passages which lead into circumferential grooves and/or a central opening, the bottom plate of the cage being provided with openings through which the crown-shaped, cage end of the hollow shaft reaches with its segments, the ends of the segments being fixedly joined to the substrate support.

It is desirable that passages through which a gas cooling the substrate can enter into the interstice or chamber formed at least temporarily by the substrate and the substrate support.

The invention admits of a great variety of embodiments; two of them are represented diagrammatically in the appended drawings, wherein.

Figure 1:
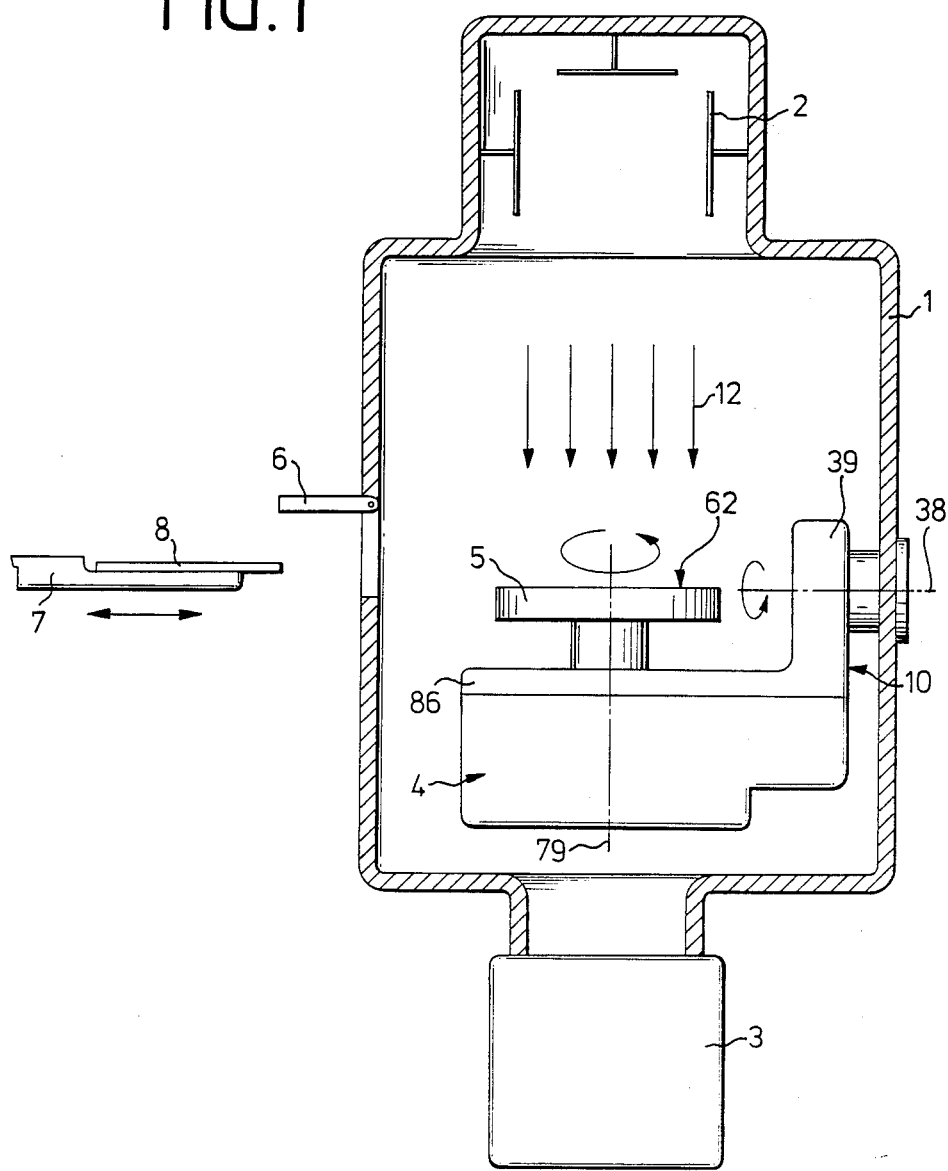
FIG. 1 shows the apparatus for coating substrates in a vacuum chamber.

The apparatus according to FIG. 1 for the accommodation of substrates 8 in an apparatus for reactive ionic etching consists essentially of the vacuum chamber 1, the ion source 2, the pump stand 3, the substrate table 4, the substrate holder 5, the airlock door 6, the loading and unloading arm 7 and the substrate 8 (e.g., a silicon wafer). The substrate holder 5 is mounted for rotation about the axis 79 in the substrate table 4 which is journaled on the wall of the vacuum chamber 1 on an arm 10 about the axis 38. With the continuous rotation of the substrate holder 5 about the axis 79 the deleterious effects of the irregularities of the ion beams 12 on the etching process are reduced. The axis 38 permits the selection of an attitude angle favorable to the process between the support surface 62 and the ion beams 12.

Figure 2:
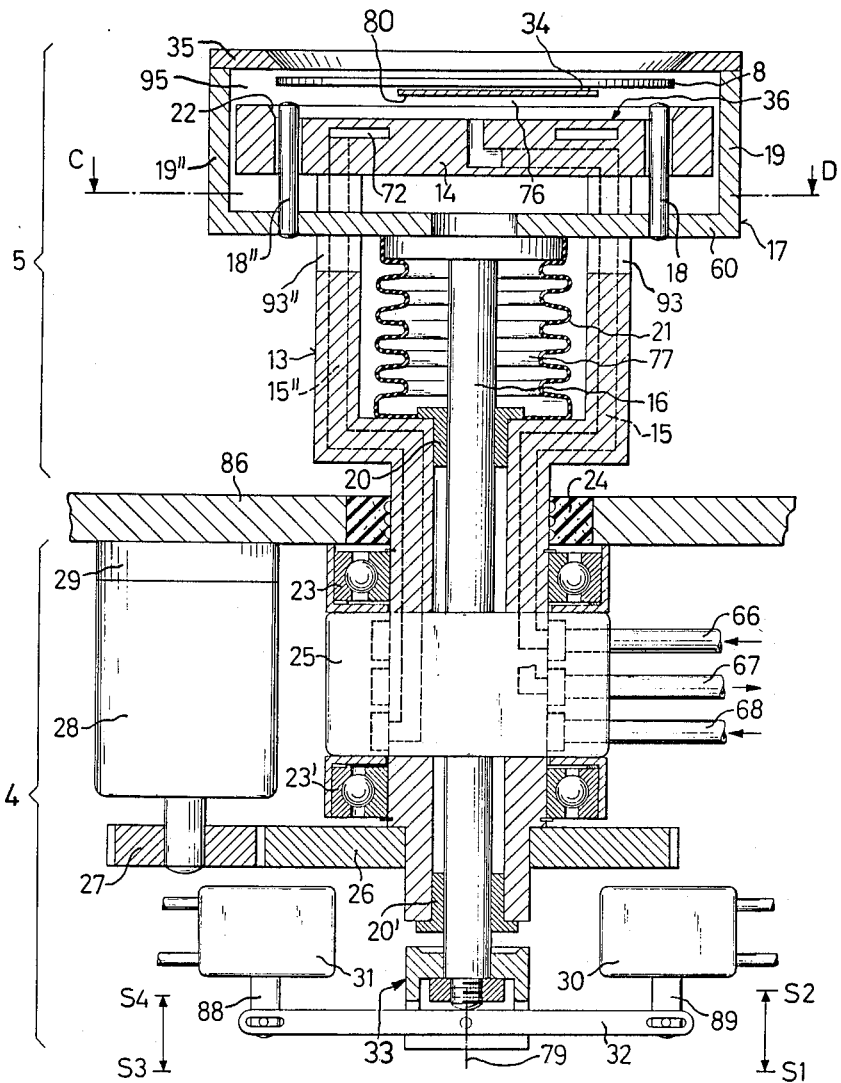
FIG. 2 is a longitudinal section through a substrate table with substrate holder for an apparatus as represented in FIG. 1.

According to FIG. 2, the substrate holder 5 is held and carried on the cover 86 of the housing of the substrate table 4. A hollow shaft 13, widened at the top and merging with three segments bears the substrate support 14, the upper end of the hollow shaft 13 being crown-like and the individual segments 93, 93', 93" of the hollow shaft being brought through openings 92, 92', 92" in the bottom plate 60 of the cage 17. The substrate support 14 is cooled with a liquid flowing through two cooling water passages of which only one is represented. The coolant is fed in and out through two bores in the wall of the hollow shaft 13. A third passage 15"

in the hollow shaft 13 carries a coolant gas, helium for example, which emerges underneath the substrate in the middle of the substrate support 14 and cools it by the conduction of heat to the substrate support 14.

In the hollow shaft 13 is the lifting rod 16 to whose upper end the cage 17 is fastened. The latter surrounds the substrate holder 14. It consists of a star-like bottom or floor plate 60 with three arms 17′, 17″, 17‴, each of which bears a raising pin 18, 18′, 18″ and a spacer 19, 19′, 19″.

The lifting rod 16 is guided by two friction bearings 20, 20′, and secured against distortion by the bellows 21. The bellows 21 also seals off the interior of the hollow shaft 13 from the vacuum chamber 1. Between the bottom plate 60 and the crown-like cage end of the hollow shaft there can also be disposed a jack 77 which is connected to a suitable hydraulic pump and control (not shown). The lifting rod 16 can assume three positions, high, middle and low. In the middle position the cage 17 is raised with respect to the substrate support 14 so that a thin loading and unloading arm 7 can push the discoidal substrate 8 through the gap 95 into the cage 17 and position it centrally above the substrate support 14. The lifting rod 16 then moves to the "high" position, while the lifting pins 18, 18′ and 18″ lift the substrate 8 from the arm 7. After the arm 7 has been withdrawn in the direction of the arrow F, the lifting rod 16 sinks to the low position while allowing the substrate 8 to slide to the supported position over the inner edges 22 of the substrate support which are beveled as an aid to its guidance. The clamping ring 35 finally presses the substrate 8 tightly against the support surface 36.

For the removal of the substrate after the etching process, the lifting rod 16 shifts to the high position; the arm 7 slides under it, and then, when the lifting rod 16 is lowered to the middle position, the substrate 8 is laid onto the nubs 34, 34′, 34″ of the arm 7 and then it is removed laterally.

The hollow shaft 13 is journaled in the substrate table 4 by means of the bearings 23 and 23′. Sealing against the vacuum is accomplished by a sealing ring 24, a ferrofluidic seal being preferred. The delivery and return of the cooling water through the lines 15 and 15′ and water inlet 68 and water outlet 67 and the introduction of the cooling gas through the gas inlet 66 into the hollow shaft 13 are performed through a rotary connection 25. The hollow shaft 13 is driven through a pair of gears 26, 27, by a motor drive unit 28. A synchro 29 is integrated into the latter so that the position of the hollow shaft 13 can be measured. It is thus possible to align the cage 17 with the arm 7 with sufficient accuracy for the loading and unloading processes. The three positions of the lifting rod 16 are arrived at by means of two pneumatic cylinders 30 and 31 whose plungers can assume the step positions S1 and S2, and S3 and S4, respectively. The cylinders 30 and 31 can be disposed mechanically in series or, as shown in FIG. 2, they can be coupled by a differential lever 32. In this case the upper position of the lifting rod 16 can be produced by the step position S2, S4, the middle one by S1, S4 or S2, S3, and the lower position by S1, S3. The application of power to the lifting rod 16 is performed in this case through a rotary bearing 33, e.g., a grooved ball bearing which permits free rotation of the lifting rod 16 but transmits axial forces.

Figure 3:
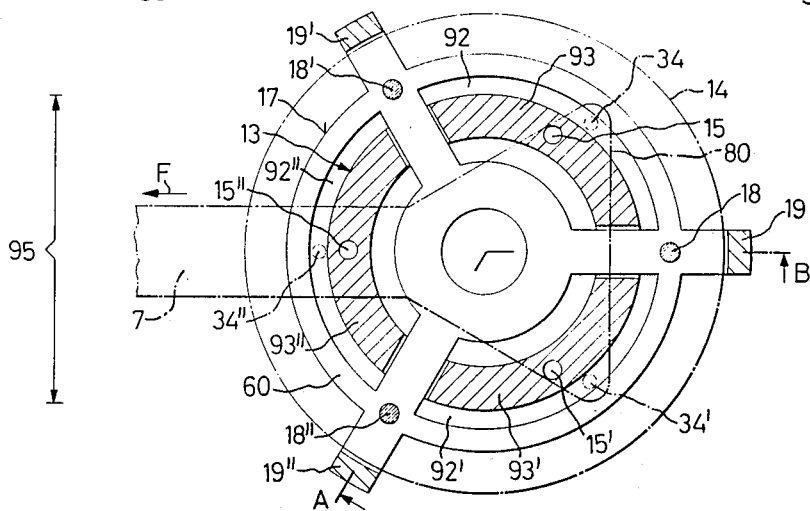
FIG. 3 is a section taken along line C-D of FIG. 2.

FIG. 3 explains, in a top view, how the inserting arm 7 is positioned in the cage 17 when the substrate 8 is deposited or removed.

The advantage of the automation of the substrate table lies on the one hand in the fact that this permits the automation of the entire apparatus, which is a fundamental requirement of a production plant, and on the other hand that the risk of particle contamination is substantially reduced. In particular the apparatus according to the invention has the advantage that no mechanical friction occurs in the rotatory or raising and lowering movements and thus no particles are produced. Furthermore, the problem of cooling the substrate support 14 and substrate 8 is solved in an appropriate manner.

Figure 4:
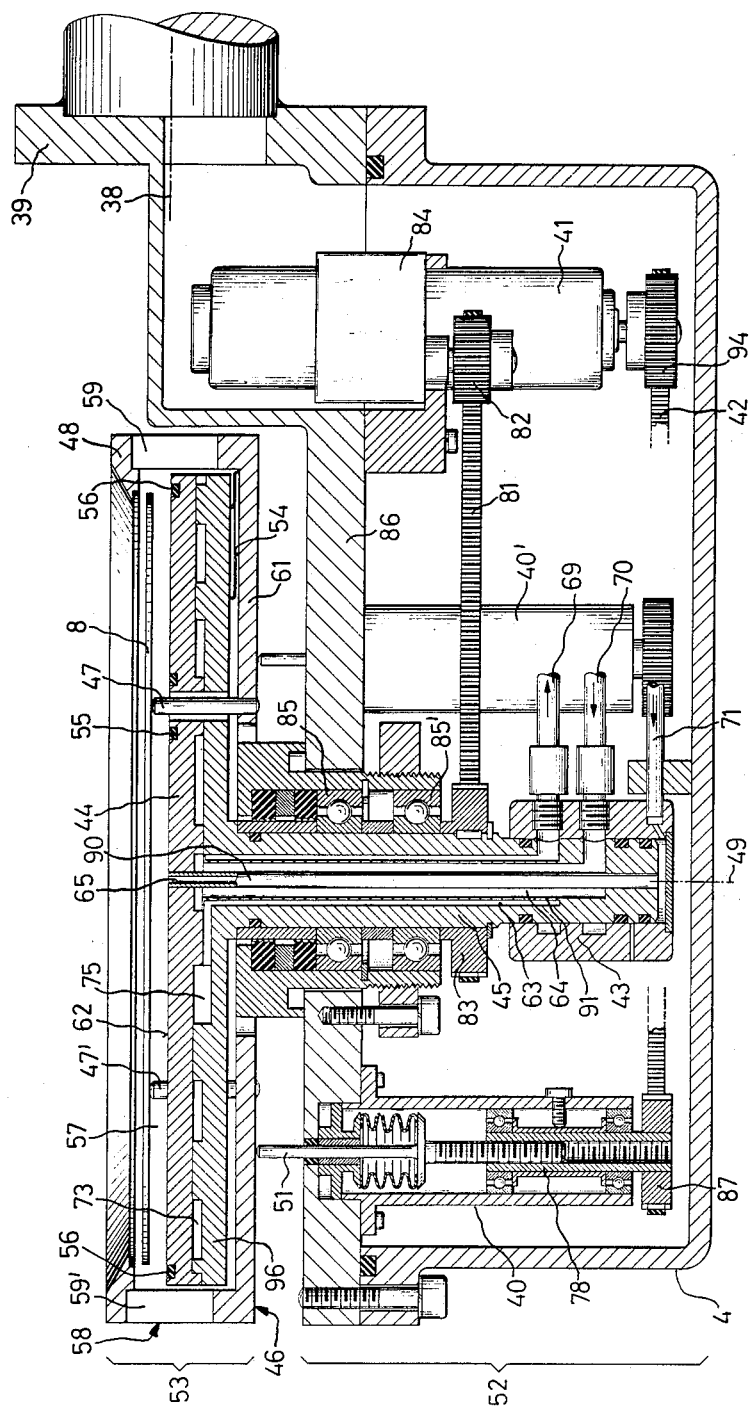
FIG. 4 is a cross section through an alternative embodiment of an apparatus with substrate table and substrate holder.

FIG. 4 is a diagrammatic representation of another embodiment of the invention. The substrate table 52 is constructed for rotation about the axis 38 on a flange 39. The substrate table 52 contains three lifters 40, 40′, 40″, which are driven by an electric motor 41 through cogbelts 42, a rotary connection 43 including bearings and seals, the substrate holder 53 rotatable about the axis 49, and an electric motor 84 for rotating the substrate holder through cogbelts 81. The substrate holder 53 consists of the watercooled substrate holder 44, the bottom plate 61, the hollow shaft 45 and the cage 46 with raising and guiding pins 47, 47′, 47″. In the position of rest the plungers 51, 51′, 51″ of the lifting devices 40, 40′, 40″, are retracted into the substrate table 52. The cage 46 is urged downwardly by the left spring 54 and with its upper ring 48 it presses the substrate 8 onto the substrate plate 44. Ring gaskets 55 and 56 are provided in the plate 44 along the circumference of the latter and around the openings 37 for the raising and guiding pins 47. Their purpose is to provide a seal between the back of the substrate and the support surface 62 when the substrate 8 is in the clamped state. Helium or another suitable gas is blown into the space 57 thus closed during the processing of the substrate 8 so as to increase the thermal conductivity between the substrate 8 and the support plate 44. For the loading and unloading of the substrate 8 the cage 47 is raised to the "high" position by extending the three lifting devices 40. In the "high" position of the cage 46 the three lifting pins 47 extend from the plate 44 and carry the substrate 8. For loading and unloading, a suitable fork or a loading and unloading arm 7 runs through a slot 58 between the spacers 59, 59′, of the cage 46 (not shown in the drawing) into the gap between the back of the substrate and the substrate support 44. After the loading and unloading arm 7 has entered, the cage 47 is lowered to the "middle" position. This is done by lowering the three lifting devices 40. In this position the lifting pins 47 are lowered to such an extent that the substrate 8 lies freely on the loading and unloading arm 7. By running out the loading and unloading arm together with the substrate 8 lying thereon the apparatus is unloaded. Loading is performed in reverse order.

It is to be noted that the plungers 51 are moved by the spindle-and-nut drive 78 which can be driven through the gear 87. The gear 83 which cooperates with the cogbelt 81 is pressed onto the hollow shaft 45. The coolant passages 63, 64, 65, in the interior of the hollow shaft 45 are separated from one another by means of thin-walled tubes 90 and 91, and are connected by annular passages to the pipelines 69, 70 and 71 on the one hand, and on the other hand to the cooling passages 73, 74 and 75. 96 identifies a flange portion which is part of the hollow shaft 45.

We claim:

1. Apparatus for mounting workpieces, preferably discoidal substrates, in a vacuum chamber for the purpose of surface treatment, especially for reactive ionic etching or for coating by cathode sputtering comprising:
   a substrate support having a substrate support surface and an axis normal thereto, said support being axially stationary;
   a hollow shaft connected with said substrate support;
   a bottom plate disposed underneath the support;
   a plurality of spacers;
   clamping means extending approximately parallel to said substrate support surface;
   said bottom plate, said spacers and said clamping means forming an axially displaceable cage partially surrounding said support and held coaxial with said support and having a sidewall opening, while the substrate which can be introduced through said opening between an adjacent two of said spacers can be deposited on said substrate support surface and can be held there by said clamping means after axial movement of said cage.

2. Apparatus according to claim 1, in which said hollow shaft connected to the substrate support has cooling passages and passages which at one end correspond with inlet and outlet lines and at an other end with said cooling passages in the substrate support.

3. Apparatus according to claim 1, which includes one or more actuators and in which said cage is displaceable with respect to said substrate support by said one or more actuators.

4. Apparatus according to claim 1, which includes raising pins and a loading and unloading arm which can travel transversely of said axis normal to said substrate support into said opening which is formed by said two adjacent spacers, said clamping means and said bottom plate of said cage, and said arm having an end facing the apparatus and having a mounting for the substrate, said mounting having a configuration through which said raising pins reach, said raising pins being disposed on said bottom plate of said cage and thus coming in contact with the substrate and lifting it from said mounting or laying it thereon.

5. Apparatus according to claim 1, which includes a motor and a drive, a housing cover and a bearing in said housing cover, and in which said hollow shaft is rotatably driven by said motor through said drive and for this purpose is held in said bearing in said housing cover.

6. Apparatus according to claim 1, which includes a housing journaled for rotation about an axis on the apparatus, which runs in the plane of said substrate support surface.

7. Apparatus according to claim 1, which includes at least one lifting rod and in which said cage is supported by said bottom plate on said at least one lifting rod, said lifting rod being driven by a lifting cylinder.

8. Apparatus according to claim 1, which includes a two-arm differential lever and cylinders having connecting rods and inserted into a hydraulic fluid circuit and in which said lifting rod is supported on said two-arm differential lever (32) having ends which cooperate with said connecting rods of said cylinders which are inserted into said hydraulic fluid circuit.

9. Apparatus according to claim 1, which includes several thin-walled tubes disposed concentrically to one another and in which said hollow shaft has several concentric passages which are separated from one another by said several thin-walled tubes disposed concentrically to one another.

10. Apparatus according to claim 9, in which on said substrate support surface said passages open, through which a gas cooling the substrate flows into an interstice which is at least temporarily defined by the substrate and said substrate support.

11. Apparatus according to claim 1, in which said bottom plate of said cage has openings through a cage end, of crown-like configuration, and said hollow shaft reaches said cage end with segments, ends of said segments being in permanent operative connection with the substrate support.

* * * * *